US012701837B2

(12) United States Patent
Zhu et al.

(10) Patent No.: US 12,701,837 B2
(45) Date of Patent: Aug. 4, 2026

(54) DISPLAY PANEL AND DISPLAY DEVICE USING THE SAME

(71) Applicants: BOE MLED Technology Co., Ltd., Beijing (CN); BOE Technology Group Co., Ltd., Beijing (CN)

(72) Inventors: Heling Zhu, Beijing (CN); Chenchang Chen, Beijing (CN); Xiawei Yun, Beijing (CN); Yuanhao Sun, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 717 days.

(21) Appl. No.: 18/018,723

(22) PCT Filed: Jan. 26, 2022

(86) PCT No.: PCT/CN2022/073989
§ 371 (c)(1),
(2) Date: Jan. 30, 2023

(87) PCT Pub. No.: WO2023/141810
PCT Pub. Date: Aug. 3, 2023

(65) Prior Publication Data
US 2024/0258475 A1 Aug. 1, 2024

(51) Int. Cl.
*H10H 20/856* (2025.01)
*G02F 1/13357* (2006.01)
*H10W 90/00* (2026.01)

(52) U.S. Cl.
CPC .......... *H10H 20/856* (2025.01); *H10W 90/00* (2026.01)

(58) Field of Classification Search
CPC .. H10H 20/856; H01L 25/0753; G02F 1/1336
See application file for complete search history.

(56) References Cited

U.S. PATENT DOCUMENTS

2022/0130810 A1* 4/2022 Park .................. H10H 20/8515
2022/0165993 A1 5/2022 Leng

FOREIGN PATENT DOCUMENTS

CN      108572481 A      9/2018
CN      109188776 A      1/2019
(Continued)

OTHER PUBLICATIONS

Office Action dated Dec. 6, 2025, issued in counterpart CN Application No. 202280000086.0 with English translation. (21 pages).

*Primary Examiner* — Antonio B Crite
(74) *Attorney, Agent, or Firm* — WHDA, LLP

(57) ABSTRACT

A display panel relates to the display technical field, including a substrate; at least one light-emitting unit, located on the substrate; first reflective walls, arranged surrounding the light-emitting unit, wherein a height of the first reflective walls along a direction perpendicular to the substrate is greater than a height of the light-emitting unit along the direction perpendicular to the substrate; and a first microstructure layer, located on a side of the first reflective wall away from the substrate, wherein orthographic projections of the first microstructure layer on the substrate at least overlap orthographic projections of the first reflective walls on the substrate, and a distance between the first microstructure layer and the substrate along the direction perpendicular to the substrate is greater than or equal to a distance between a surface of the first reflective walls away from the substrate and the substrate along the direction perpendicular to the substrate.

18 Claims, 28 Drawing Sheets

(56)     References Cited

FOREIGN PATENT DOCUMENTS

| CN | 109686868 A | 4/2019 |
| CN | 110429200 A | 11/2019 |
| CN | 111370560 A | 7/2020 |
| CN | 111933631 A | 11/2020 |
| CN | 211879404 U | 11/2020 |
| CN | 112447931 A | 3/2021 |
| JP | 2011-216281 A | 10/2011 |

* cited by examiner

DISPLAY PANEL AND DISPLAY DEVICE USING THE SAME

CROSS-REFERENCE TO RELATED APPLICATION

The present disclosure is a National Stage of International Application No. PCT/CN2022/073989, filed on Jan. 26, 2022, with the title of "DISPLAY PANEL AND DISPLAY DEVICE USING THE SAME", which is incorporated herein in its entirety by reference.

FIELD

The application relates to the display technology field, in particular to a display panel and a display device using the display panel.

BACKGROUND

Compared with traditional Liquid Crystal Display (LCD) and Organic Light-Emitting Diode (OLED) display technologies, Mini/Micro Light-Emitting Diode (Mini/Micro LED) display technology has attracted extensive attention in the industry due to its high display contrast and excellent image quality.

SUMMARY

The embodiments of the application adopt the following technical solution:

In the first aspect, an embodiment of the application provides a display panel, including:

a substrate;

at least one light-emitting unit, located on the substrate;

first reflective walls, each arranged surrounding the light-emitting unit, wherein a height of the first reflective walls along a direction perpendicular to the substrate is greater than a height of the light-emitting unit along the direction perpendicular to the substrate; and a first microstructure layer, located on a side of the first reflective wall away from the substrate, wherein orthographic projections of the first microstructure layer on the substrate at least overlap orthographic projections of the first reflective walls on the substrate, and a distance between the first microstructure layer and the substrate along the direction perpendicular to the substrate is greater than or equal to a distance between a surface of the first reflective walls away from the substrate and the substrate along the direction perpendicular to the substrate.

In some embodiments of the application, the first microstructure layer and the first reflective walls are of an integrated structure; and the distance between the first microstructure layer and the substrate along the direction perpendicular to the substrate is equal to the distance between the surface of the first reflective walls away from the substrate and the substrate along the direction perpendicular to the substrate.

In some embodiments of the application, the display panel further includes a functional layer, the functional layer is located on the side of the first reflective wall away from the substrate, the first microstructure layer is located on a side of the functional layer away from the first reflective wall, and the first microstructure layer and the functional layer are of an integrated structure; and the distance between the first microstructure layer and the substrate along the direction perpendicular to the substrate is greater than the distance between the surface of the first reflective walls away from the substrate and the substrate along the direction perpendicular to the substrate.

In some embodiments of the application, an orthographic projection of the functional layer on the substrate overlaps the orthographic projections of the first reflective walls on the substrate, and the orthographic projection of the functional layer on the substrate overlaps the orthographic projection of the light-emitting unit on the substrate.

In some embodiments of the application, the functional layer is a patterned film structure, an orthographic projection of the functional layer on the substrate overlaps the orthographic projections of the first reflective walls on the substrate, and the orthographic projection of the functional layer on the substrate does not overlap the orthographic projection of the light-emitting unit on the substrate.

In some embodiments of the application, the light-emitting unit includes a plurality of light-emitting subunits on the substrate, a second reflective wall is further arranged between two adjacent light-emitting subunits in a same light-emitting unit, and the first reflective walls and the second reflective walls are arranged in a same layer; and the orthographic projection of the functional layer on the substrate overlaps orthographic projections of the second reflective walls on the substrate, and the orthographic projections of the first microstructure layer on the substrate overlap the orthographic projections of the second reflective walls on the substrate.

In some embodiments of the application, the orthographic projections of the reflective walls on the substrate are within the orthographic projections of the first microstructure layer on the substrate, orthographic projections of the light-emitting subunits on the substrate and the orthographic projections of the first microstructure layer on the substrate do not overlap each other, the reflective walls include the first reflective walls and the second reflective walls, and the first reflective walls are connected with the second reflective walls.

In some embodiments of the application, the display panel further includes a second microstructure layer; and orthographic projections of the second microstructure layer on the substrate overlap the orthographic projection of the light-emitting unit on the substrate, and the orthographic projections of the second microstructure layer on the substrate are connected with the orthographic projections of the first microstructure layer on the substrate.

In some embodiments of the application, both a surface of the first microstructure layer away from the substrate and a surface of the second microstructure layer away from the substrate have rough microstructures, and a distribution density of the microstructures in the first microstructure layer is greater than that in the second microstructure layer.

In some embodiments of the application, the distribution density of the microstructures gradually decreases along a first direction, and the first direction is a direction that the first microstructure layer points to the second microstructure layer.

In some embodiments of the application, in a circumstance that the orthographic projection of the functional layer on the substrate overlaps the orthographic projection of the light-emitting unit on the substrate, the second microstructure layer is located on a side of the functional layer away from the substrate, and the second microstructure layer and the functional layer are of the integrated structure, and the second microstructure layer and the first microstructure layer are arranged in a same layer.

In some embodiments of the application, the functional layer, the first reflective walls and the substrate constitute an enclosed space, and the light-emitting unit and the second reflective walls are all located in the enclosed space; and the display panel further includes a first filling layer, the first filling layer fills a space in the enclosed space except the light-emitting unit and the second reflective walls, and at least one of the first filling layer and the functional layer includes diffusion particles.

In some embodiments of the application, a material of the functional layer includes a black composite, and a material of the first filling layer includes a light-transmitting composite; or the functional layer and the first filling layer are of the integrated structure, and the materials of both the functional layer and the first filling layer include the black composite.

In some embodiments of the application, in a circumstance that the orthographic projection of the functional layer on the substrate does not overlap the orthographic projection of the light-emitting unit on the substrate, the display panel further includes a second filling layer, and the second filling layer covers the light-emitting subunits; and the second microstructure layer is located on a side of the second filling layer away from the substrate.

In some embodiments of the application, a distance between a surface of the second filled layer away from the substrate and the substrate along the direction perpendicular to the substrate is equal to a distance between a surface of the functional layer away from the substrate and the substrate along the direction perpendicular to the substrate; and the second microstructure layer and the second filling layer are of the integrated structure, and the second microstructure layer and the first microstructure layer are arranged in a same layer.

In some embodiments of the application, the second filling layer further covers the functional layer, and a distance between a surface of the second microstructure layer away from the substrate and the substrate along the direction perpendicular to the substrate is greater than a distance between a surface of the first microstructure layer away from the substrate and the substrate along the direction perpendicular to the substrate.

In some embodiments of the application, the display panel further includes a protective layer, and the protective layer covers the second filling layer and the functional layer.

In some embodiments of the application, a refractive index of the reflective wall is less than a refractive index of the first filled layer, and the reflective wall is configured to enable at least part of light emitted from the first filled layer to the reflective wall to occur total reflection.

In the second aspect, an embodiment of the present application further provides a display device, including a display panel as described above.

The above description is only an overview of the technical solution of the application. In order to better understand the technical means of the application, implement them according to the content of the description, and make the above and other purposes, features and advantages of the application clearer and more understandable, the implementation modes of the application are specifically described below.

BRIEF DESCRIPTION OF THE DRAWINGS

In order to more clearly describe the embodiments of the application or the technical solutions in the related technologies, the following will briefly introduce the drawings needed to be used in description of the embodiments or the prior art. Apparently, the drawings in the following description are only some embodiments of the application. For those ordinary skilled in the art, they may also obtain other drawings based on these drawings without paying creative labor.

DETAILED DESCRIPTION OF THE EMBODIMENTS

Figure 1:
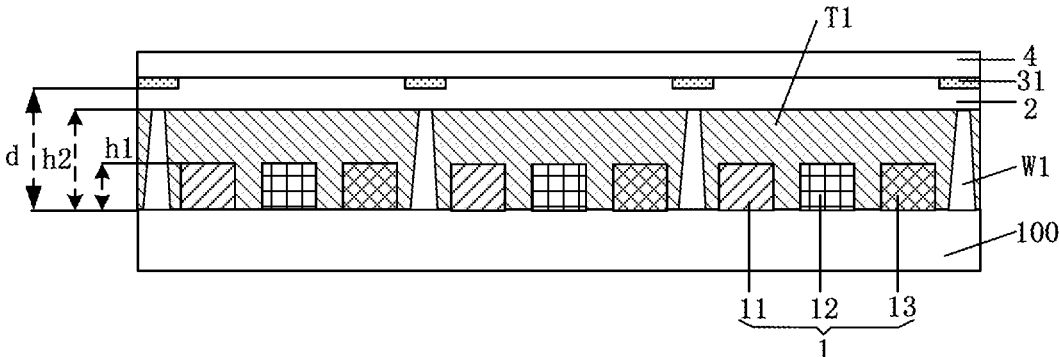
FIG. 1-FIG. 22 are structural diagrams of twenty-two kinds of display panels provided in embodiments of the application.

The technical solutions in the embodiments of the application will be described clearly and completely below in combination with the drawings in the embodiments of the application. Apparently, the described embodiments are only part of the embodiments of the application, not all of them. Based on the embodiments in the application, all other embodiments obtained by those ordinary skilled in the art without doing creative work belong to the scope of protection in the application.

In the drawings, thicknesses of areas and layers may be exaggerated for clarity. The same reference numerals in the drawings represent the same or similar structures, and therefore their detailed description will be omitted. In addition, the accompanied drawings are only schematic diagrams of the application and are not necessarily drawn to scale.

Unless the context otherwise requires, in the entire description and claims, the term "including" is interpreted as open and inclusive, that is, "including, but not limited to". In the description of the specification, the terms "an embodiment", "some embodiments", "an exemplary embodiment", "an example", "a specific examples" or "some examples" are intended to indicate that specific features, structures, materials or characteristics related to the embodiment or example are included in at least one embodiment or example of the application. The exemplary expression of the above terms is not necessarily indicative of the same embodiment or example. In addition, the specific features, structures, materials, or characteristics may be included in any one or more embodiments or examples in any suitable manner.

In the embodiments of the application, words such as "first" and "second" are used to distinguish the same or similar items with basically the same function and action, which is only to clearly describe the technical solution of the embodiments of the application, and may not be understood as indicating or implying the relative importance or implicitly indicating the number of indicated technical features.

The development of Mini/Micro LED display technology is not yet mature, and there is a significant problem of chromatic aberration of large view angle.

Figure 2:
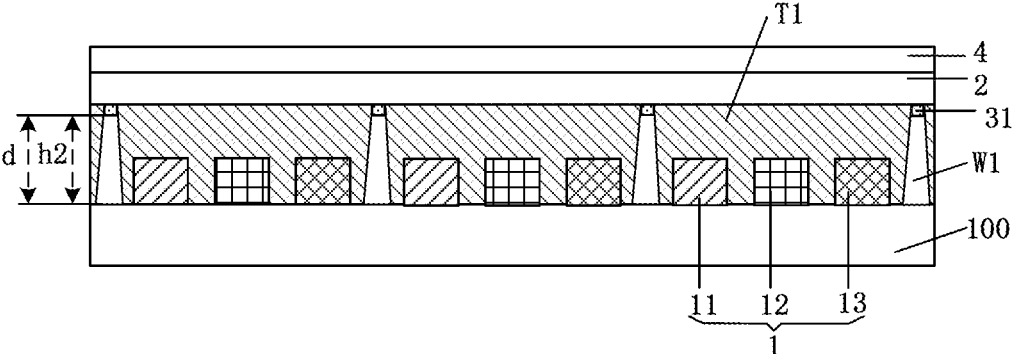

An embodiment of the application provides a display panel, referring to that shown in FIG. 1 or FIG. 2, including:

a substrate 100;

at least one light-emitting unit 1 located on the substrate 100;

first reflective walls W1, arranged respectively surrounding the light-emitting units 1, wherein a height h2 of the first reflective walls W1 along a direction perpendicular to the substrate 100 is greater than a height h1 of the light-emitting units 1 along the direction perpendicular to the substrate 100; and a first microstructure layer 31, located on a side of the first reflective walls W1 away from the substrate 100;

wherein orthographic projections of the first microstructure layer 31 on the substrate 100 at least respectively overlap orthographic projections of the first reflective walls W1 on the substrate 100, and a distance d between the first microstructure layer 31 and the substrate 100 along the direction perpendicular to the substrate 100, is greater than or equal to, a distance h2 between a surface of the first reflective walls W1 away from the substrate 100 and the substrate 100 along the direction perpendicular to the substrate 100.

In an exemplary embodiment, the light-emitting unit 1 includes a plurality of light-emitting subunits, for example, including a light-emitting subunit 11, a light-emitting subunit 12, and a light-emitting subunit 13.

In an exemplary embodiment, when the display panel directly displays, the light-emitting colors of each light-emitting subunit in the same light-emitting unit 1 are different, for example, the light-emitting subunit 11 emits red light, the light-emitting subunit 12 emits green light, and the light-emitting subunit 13 emits blue light.

In an exemplary embodiment, when the display panel is used as a backlight of display product, and the display product further includes a color conversion layer on a light outlet side of the light-emitting units, the light-emitting color of the respective light-emitting subunits in the same light-emitting unit 1 may be the same. By way of example, the light-emitting subunits may emit blue light at this time.

Here, there is no limit on a specific structure of the light-emitting subunit. Exemplarily, the light-emitting subunit may be a light-emitting chip, for example, the light-emitting subunit may be a Mini LED chip or a Micro LED chip.

Here, an arrangement manner of the light-emitting unit 1 is not limited, and the details may be determined according to an actual situation. The accompanied drawings provided by the embodiments of the present application are drawn by taking a plurality of light-emitting units 1 being arranged in a rectangular array as an example.

Figure 3:
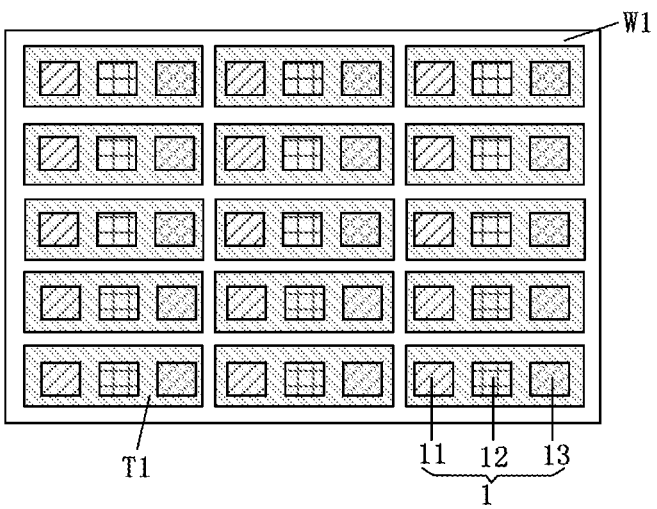

In an exemplary embodiment, referring to that shown in FIG. 3, the first reflective walls W1 is in a mesh structure. It may be understood that the first reflective walls W1 respectively surrounding the respective light-emitting units 1 are connected as a whole. The first reflective wall W1 surrounding each light-emitting unit 1 may also be a separate structure, that is, the first reflective walls W1 surrounding two adjacent light-emitting units 1 are not connected. The embodiments of the present application are illustrated by taking the first reflective walls W1 respectively surrounding the respective light-emitting units 1 being connected as a whole as an example.

In an exemplary embodiment, a shape formed by an inner contour of the orthographic projection of the first reflective wall W1 surrounding each light-emitting unit 1 on the substrate 100 may be a polygon, for example, the polygon may be a rectangle as shown in FIG. 3. Alternatively, the shape formed by the inner contour of the orthographic projection of the first reflective wall W1 surrounding each light-emitting unit 1 on the substrate 100 may also be an arc, for example, the arc may be an ellipse. Alternatively, the shape formed by the inner contour of the orthographic projection of the first reflective wall W1 surrounding each light-emitting unit 1 on the substrate 100 may also be a shape formed by a combination of the polygons and arcs, for example, a shape formed by combining a rectangle with two semicircles.

In an exemplary embodiment, the height h2 of the first reflective walls W1 along the direction perpendicular to the substrate 100 is equal to two to three times the height h1 of the light-emitting units 1 along the direction perpendicular to the substrate 100.

Figure 20:
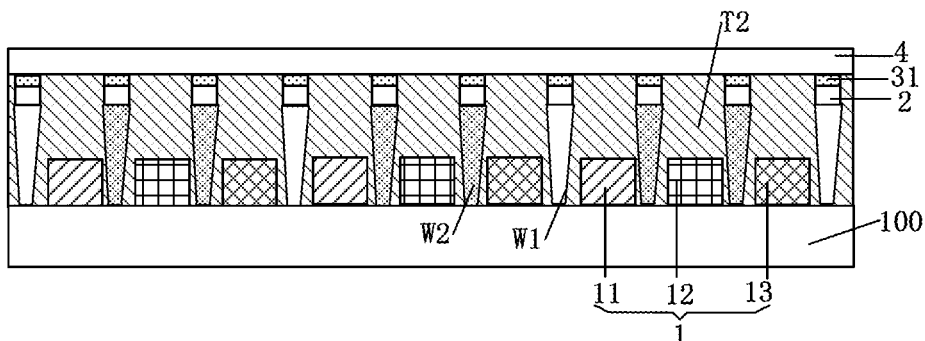
Figure 21:
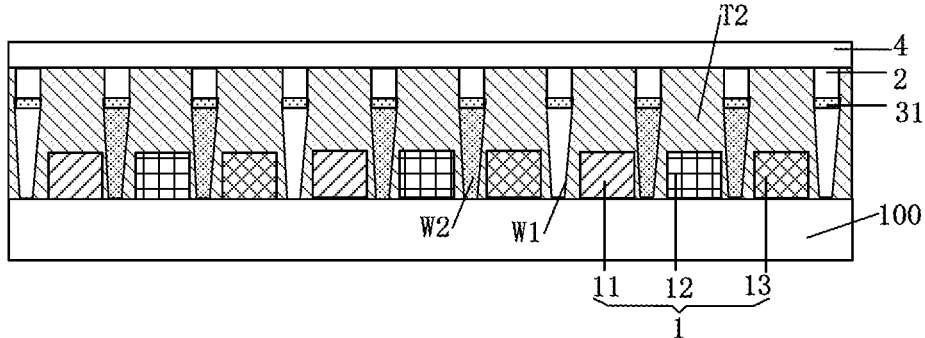

In an exemplary embodiment, a shape of a section pattern of the first reflective wall W1 along the direction perpendicular to the substrate 100 may be a trapezoid or an inverted trapezoid referring to that shown in FIGS. 20 and 21.

In an exemplary embodiment, a material of the first reflective wall W1 is a light-transmitting material with a certain range of refractive index, for example, the refractive index of the material of the first reflective wall W1 is less than a refractive index of a material of a filling layer (a first filling layer T1 or a second filling layer T2) between the first reflective wall W1 and the light-emitting unit 1.

Exemplarily, the material of the first reflective walls W1 may further include reflective particles, such as titanium dioxide particles.

Exemplarily, the reflective walls (including the first reflective walls W1 and the second reflective walls W2) may adopt 3D printing, embossing, dispensing and other processes, but not limited to these production methods.

Figure 4:
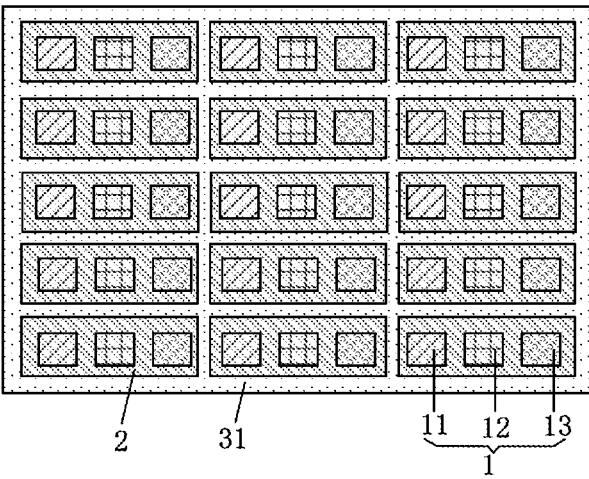

In an exemplary embodiment, the orthographic projections of the first microstructure layer 31 on the substrate 100 at least respectively overlap the orthographic projections of the first reflective walls W1 on the substrate 100, which means that: first, as shown in combining FIGS. 3 and 4, the orthographic projections of the first microstructure layer 31 on the substrate 100 only respectively overlap the orthographic projections of the first reflective walls W1 on the substrate 100; and secondly, in a circumstance that the display panel further includes the first filling layer T1, the orthographic projections of the first microstructure layer 31 on the substrate 100 not only respectively overlap the orthographic projections of the first reflective walls W1 on the substrate 100, but also respectively partially overlap an orthographic projection of the first filling layer T1 on the substrate 100.

It should be noted that the orthographic projections of the first microstructure layer 31 on the substrate 100 only respectively overlap the orthographic projections of the first reflective walls W1 on the substrate 100, which may be understood as follows: referring to that shown in FIG. 2, an outer contour of the orthographic projection of the first microstructure layer 31 on the substrate 100 overlaps an outer contour of an orthographic projection of the surface of the first reflective wall W1 away from the substrate 100 on the substrate 100; and alternatively, an outer contour of an orthographic projection of a surface of the first microstructure layer 31 away from the substrate 100 on the substrate 100 is located within an outer contour of the orthographic projection of the first reflective wall W1 on the substrate 100.

In an exemplary embodiment, referring to that shown in FIG. 2, when the first microstructure layer 31 is located on a side of the first reflective wall W1 away from the substrate 100, and is in direct contact with the first reflective wall W1, the distance d between the first microstructure layer 31 and the substrate 100 along the direction perpendicular to the substrate 100 is equal to the distance h2 between the surface of the first reflective wall W1 away from the substrate 100 and the substrate 100 along the direction perpendicular to the substrate 100.

In an exemplary embodiment, referring to that shown in FIG. 1, the display panel further includes a functional layer 2. When the first microstructure layer 31 is located on a side of the functional layer 2 away from the substrate 100 and is in direct contact with the functional layer 2, the distance d between the first microstructure layer 31 and the substrate 100 along the direction perpendicular to the substrate 100 is greater than the distance h2 between the surface of the first reflective wall W1 away from the substrate 100 and the substrate 100 along the direction perpendicular to the substrate 100.

In an exemplary embodiment, the surface of the first microstructure layer 31 has a rough microstructure, which may be called a pitted structure and may be prepared by embossing technology or micro engraving technology.

A specific size of the above pitted structure is not limited here. Exemplarily, the size of the pitting structure may be in nanometer level or micrometer level.

It should be noted that other structures and film layers may further be included between the substrate 100 and respective light-emitting units 1. Here, only the structures related to the invention point are introduced, and other structures and components included in the display panel may be referred to relevant technologies.

In an embodiment of the present application, by setting the first reflective walls W1 respectively surrounding the light-emitting units 1, and the height h2 of the first reflective walls W1 along the direction perpendicular to the substrate 100 being greater than the height h1 of the light-emitting units 1 along the direction perpendicular to the substrate 100, the first reflective wall W1 may reflect at least part of large angle light emitted by the light-emitting unit 1, thus improving light efficiency of the display panel. In addition, the side of the first reflective wall W1 away from the substrate 100 is provided with the first microstructure layer 31. Since the orthographic projections of the first microstructure layer 31 on the substrate 100 at least respectively overlap the orthographic projections of the first reflective walls W1 on the substrate 100, the orthographic projections of the first microstructure layer 31 on the substrate 100 respectively surround the orthographic projections of the light-emitting units 1 on the substrate 100, so that the first microstructure layer 31 may disperse the large angle light emitted by the light-emitting unit 1 and passing through the first microstructure layer 31, thereby improving chromatic aberration of large view angle of the display panel.

It should be noted that, with a light-emitting surface of the display panel as a reference plane, a line perpendicular to the light-emitting surface is a normal line, and a normal line direction is specified as 0°. The greater the angle between an emitting light and the normal line is, the greater the view angle is. In the display panel, because light intensity of different colors of light emitted by different light-emitting subunits are different under a large view angle, a color after light mixing is different, causing the chromatic aberration of large view angle.

Figure 6:
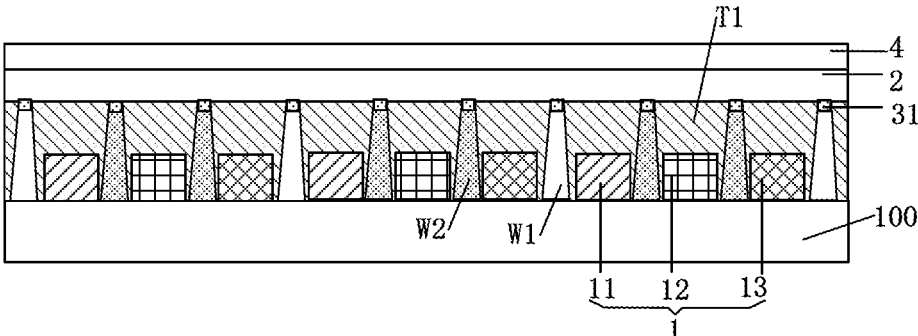
Figure 11:
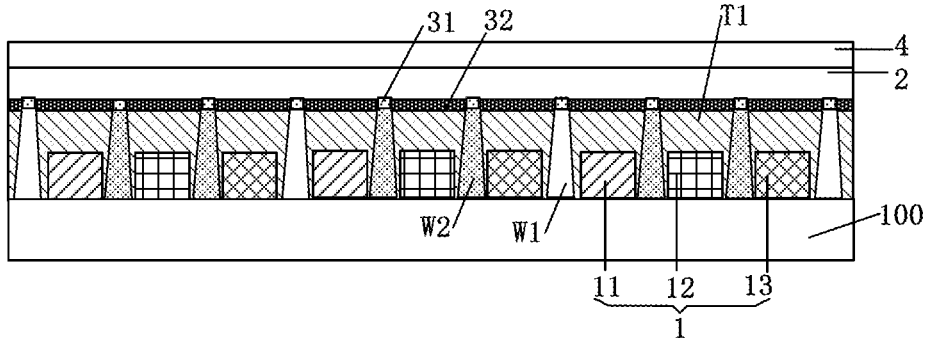

In some embodiments of the present application, referring to that shown in FIGS. 2, 6 and 11, the first microstructure layer 31 and the first reflective walls W1 are of an integrated structure; and the distance d between the first microstructure layer 31 and the substrate 100 along the direction perpendicular to the substrate 100 is equal to the distance h2 between the surface of the first reflective wall W1 away from the substrate 100 and the substrate 100 along the direction perpendicular to the substrate 100.

Taking the first microstructure layer 31 and the first reflective walls W1 being of the integrated structure as an example, a meaning of the integrated structure is explained as that: a same material is adopted, and the first microstructure layer 31 and the first reflective wall W1 are made in one process at the same time, and there is no interface between the first microstructure layer 31 and the first reflective wall W1 in fact. The description of the integration structures involved in the following text have a similar meaning here, and will not be repeated.

In an exemplary embodiment, when the first microstructure layer 31 and the first reflective walls W1 are of the integrated structure, the outer contour of the orthographic projection of the first microstructure layer 31 on the substrate 100 overlaps the outer contour of the orthographic projection of the surface of the first reflective wall W1 away from the substrate 100 on the substrate 100. Alternatively, the outer contour of the orthographic projection of the surface of the first microstructure layer 31 away from the substrate 100 on the substrate 100 is located within the outer contour of the orthographic projection of the first reflective wall W1 on the substrate 100.

In some embodiments of the present application, referring to that shown in FIG. 1, the display panel further includes a functional layer 2, which is located on the side of the first reflective wall W1 away from the substrate 100, and the first microstructure layer 31 is located on a side of the functional layer 2 away from the first reflective wall W1. The first micro structure layer 31 and the function layer 2 are of the integrated structure; and the distance d between the first microstructure layer 31 and the substrate 100 along the direction perpendicular to the substrate 100 is greater than the distance h2 between the surface of the first reflective wall W1 away from the substrate 100 and the substrate 100 along the direction perpendicular to the substrate 100.

In an exemplary embodiment, a material of the functional layer 2 is a black composite, which includes a light-transmitting polymer matrix material and a black micro nano filler.

Exemplarily, the black composite includes black glue, wherein the black glue includes silica gel and carbon black.

Exemplarily, a particle size of the carbon black ranges from 10 nm to 500 nm.

In the embodiment of the present application, on the one hand, the functional layer 2 made of black composite may reduce brightness of the display panel in a dark state, thereby improving contrast of the display panel. On the other hand, by setting the first microstructure layer 31 on a light outlet side surface of the functional layer 2, the first microstructure layer 31 may disperse the large angle light emitted by the light-emitting unit 1 and passing through the first microstructure layer 31, thereby improving chromatic aberration of large view angle of the display panel. In addition, the first microstructure layer 31 is set on the light outlet side surface of the functional layer 2, which has simple design, low preparation process difficulty, low cost and easy realization.

In some embodiments of the present application, referring to that shown in FIGS. 1 to 2, 5 to 6, and 10 to 12, an orthographic projection of the functional layer 2 on the substrate 100 overlaps the orthographic projections of the first reflective walls W1 on the substrate 100, and the orthographic projection of the functional layer 2 on the substrate 100 overlaps the orthographic projections of the light-emitting units 1 on the substrate 100. It may be understood that at this time, the functional layer 2 is a film structure of full range.

Figure 5:
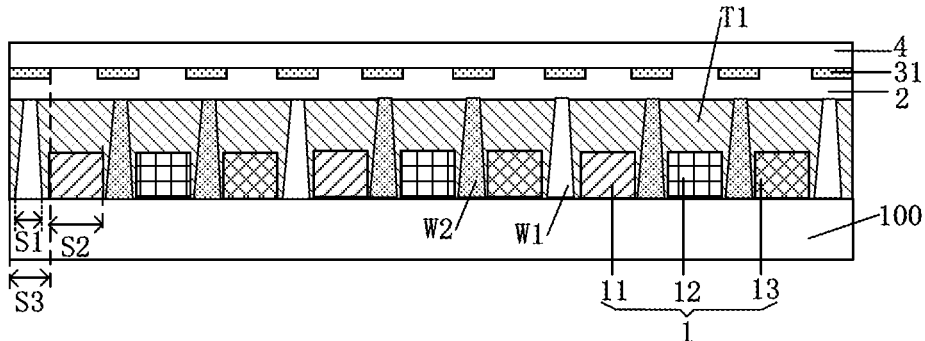
Figure 12:
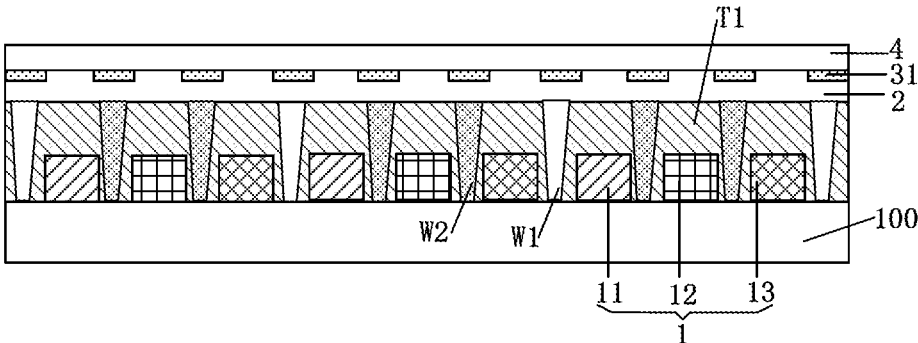

In an exemplary embodiment, referring to that shown in FIG. 1, FIG. 5 and FIG. 12, the functional layer 2 is the film structure of full range, and the orthographic projection of the functional layer 2 on the substrate 100 overlaps the orthographic projections of the reflective walls (W1 and W2) on the substrate 100. The orthographic projection of the functional layer 2 on the substrate 100 overlaps the orthographic projections of the light-emitting units 1 on the substrate 100. The first microstructure layer 31 is located on the surface of the side of the functional layer 2 away from the substrate 100, and the orthographic projections of the first microstructure layer 31 on the substrate 100 respectively overlap the orthographic projections of the reflective walls on the substrate 100.

Figure 10:
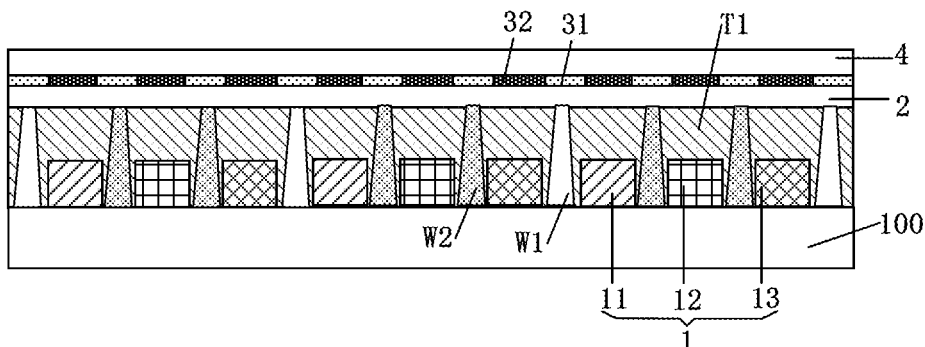

In an exemplary embodiment, referring to that shown in FIG. 10, the functional layer 2 is the film structure of full range, the orthographic projection of the functional layer 2 on the substrate 100 overlaps the orthographic projections of the reflective wall on the substrate 100, and the orthographic projection of the functional layer 2 on the substrate 100 overlaps the orthographic projections of the light-emitting units 1 on the substrate 100. The first microstructure layer 31 is located on the surface of the side of the functional layer 2 away from the substrate 100, and the orthographic projections of the first microstructure layer 31 on the substrate 100 respectively overlap the orthographic projections of the reflective walls on the substrate 100. A second microstructure layer 32 is located on the surface of the side of the functional layer 2 away from the substrate 100, and the orthographic projections of the second microstructure layer 32 on the substrate 100 respectively overlap the orthographic projections of the light-emitting units 1 on the substrate 100.

In an exemplary embodiment, referring to FIGS. 2 and 6, the functional layer 2 is the film structure of full range, the orthographic projection of the functional layer 2 on the substrate 100 overlaps the orthographic projection of the reflective wall on the substrate 100, the orthographic projection of the functional layer 2 on the substrate 100 overlaps the orthographic projections of the light-emitting units 1 on the substrate 100, and the first microstructure layer 31 is located on the surface of the side of the reflective walls away from the substrate 100.

In practical application, the material of functional layer 2 is the black composite. In a circumstance that the display panel is in a bright state, due to high light-emitting intensity of the light-emitting units 1, a very small part of display light is absorbed by the functional layer, and most of the display light may penetrate the functional layer 2. In a circumstance that the display panel is in a dark state, the functional layer 2 may absorb possible light leakage, thereby significantly reducing a dark state brightness of the display panel, thereby greatly improving the contrast of the display panel.

In some embodiments of the present application, referring to that shown in FIGS. 13 to 21, the functional layer 2 is a patterned film structure, the orthographic projection of the functional layer 2 on the substrate 100 overlaps the orthographic projections of the first reflective walls W1 on the substrate 100, and the orthographic projection of the functional layer 2 on the substrate 100 and the orthographic projections of the light-emitting units 1 on the substrate 100 do not overlap. It may be understood that at this time, the functional layer 2 is not set above the light-emitting units 1.

Figure 13:
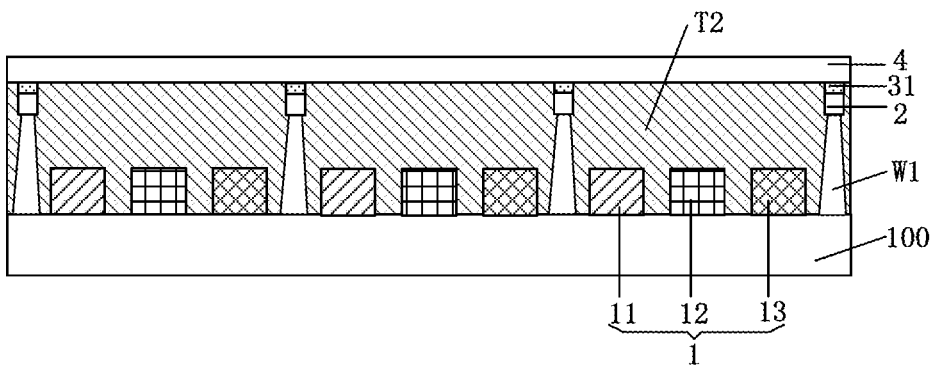
Figure 15:
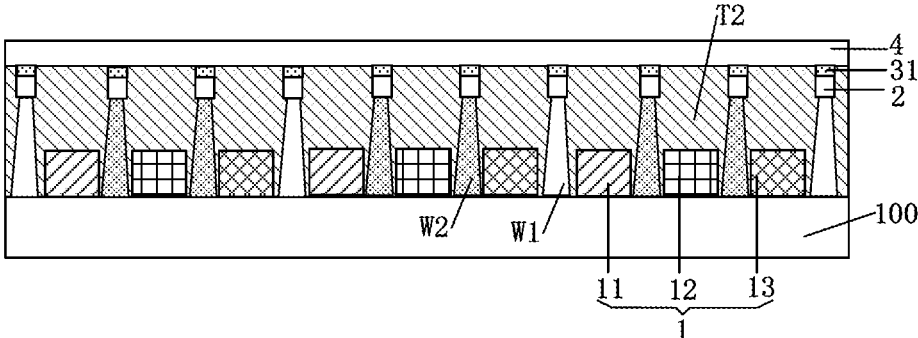

In an exemplary embodiment, referring to that shown in FIGS. 13 and 15, the first microstructure layer 31 is located on the side of the patterned functional layer 2 away from the substrate, and the orthographic projections of the first microstructure layer 31 on the substrate 100 and the orthographic projections of the reflective walls on the substrate 100 respectively overlap.

Figure 18:
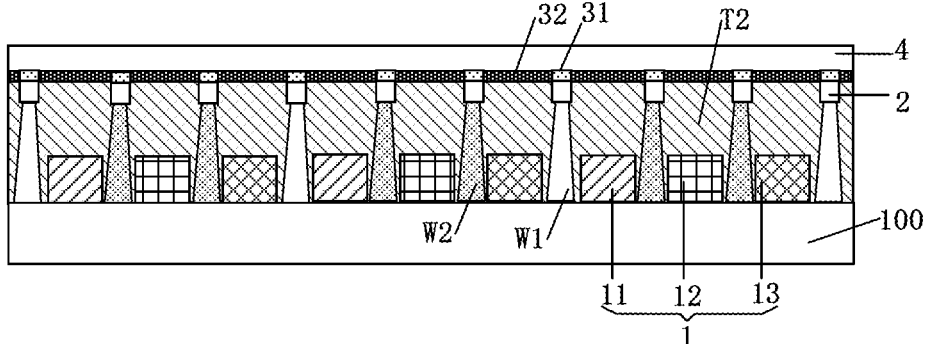

In an exemplary embodiment, referring to that shown in FIG. 18, the first microstructure layer 31 is located on the side of the patterned functional layer 2 away from the substrate. The orthographic projections of the first microstructure layer 31 on the substrate 100 respectively overlap the orthographic projections of the reflective walls on the substrate 100. The display panel further includes the second filling layer T2, the second microstructure layer 32 is located on a surface of the second filling layer T2 away from the substrate 100, and the second microstructure layer 32 and the second filling layer T2 may be of the integrated structure.

Figure 14:
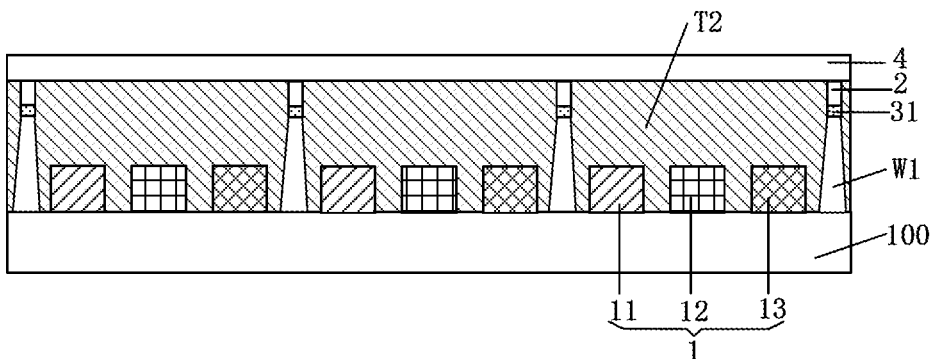
Figure 16:
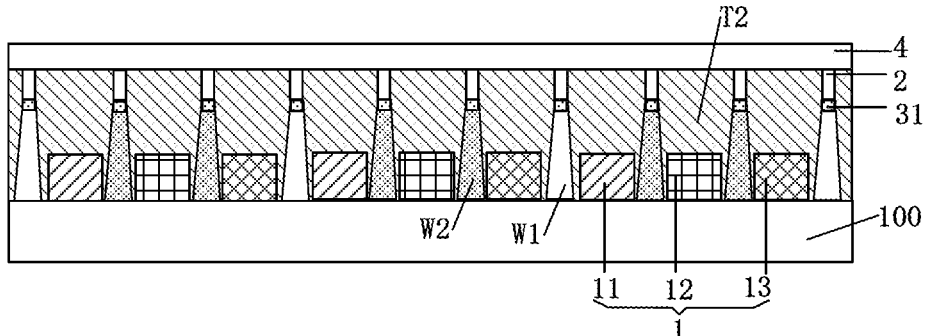

In an exemplary embodiment, referring to that shown in FIGS. 14 and 16, the first microstructure layer 31 is located between the patterned functional layer 2 and the reflective walls, and the first microstructure layer 31 and the reflective walls are of the integrated structure.

Figure 17:
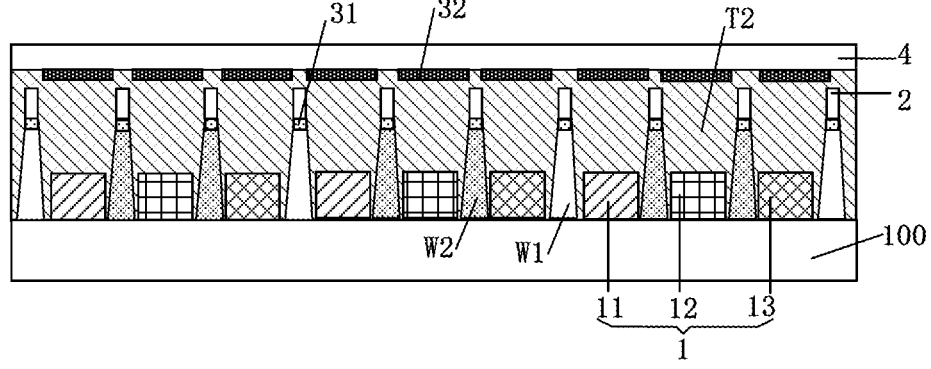
Figure 19:
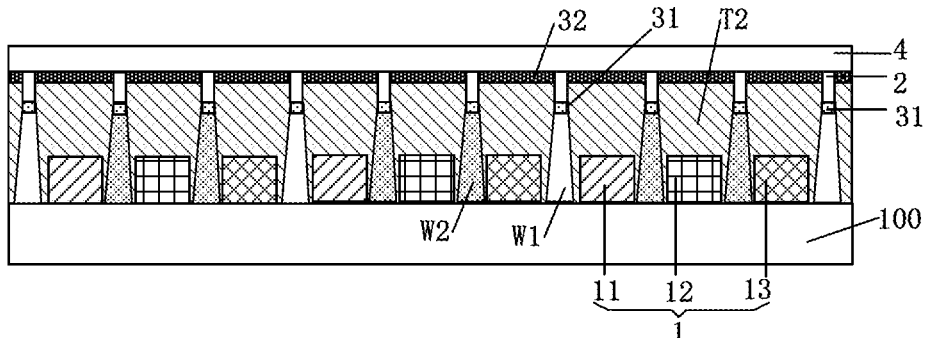

In an exemplary embodiment, referring to that shown in FIG. 17 and FIG. 19, the first microstructure layer 31 is located between the patterned functional layer 2 and the reflective walls, and the first microstructure layer 31 and the reflective walls are of the integrated structure. The display panel further includes the second filler layer T2, the second microstructure layer 32 is located on the surface of the second filler layer T2 away from the substrate 100, and the second microstructure layer 32 and the second filler layer T2 may be of the integrated structure.

In practical application, the material of functional layer 2 is the black composite. As the functional layer 2 is a patterned film structure, in a circumstance that the display panel is in the bright state, the functional layer 2 may absorb a very small part of the light emitted from the side of the light-emitting unit 1. Because the brightness of the display panel is very large in the bright state, an influence on the brightness in the bright state may be almost ignored. In a circumstance that the display panel is in the dark state, the functional layer 2 may absorb light leakage that may exist from the side of the light-emitting unit 1, which may reduce the problem of dark light leakage to a certain extent, so as to improve the contrast of the display panel to a certain extent.

In some embodiments of the present application, with reference to that shown in FIG. 5, the light-emitting unit 1 includes a plurality of light-emitting subunits located on the substrate 100 (for example, including a light-emitting subunit 11, a light-emitting subunit 12, and a light-emitting subunit 13). The second reflective wall W2 is further arranged between two adjacent light-emitting subunits (between the light-emitting subunit 11 and the light-emitting subunit 12, and between the light-emitting subunit 12 and the light-emitting subunit 13) in the same light-emitting unit 1, and the first reflective wall W1 and the second reflective wall W2 are arranged in the same layer. The orthographic projection of the functional layer 2 on the substrate 100 overlaps the orthographic projections of the second reflective walls W2 on the substrate 100, and the orthographic projections of the first microstructure layer 31 on the substrate 100 respectively overlap the orthographic projections of the second reflective walls W2 on the substrate 100.

Figure 7:
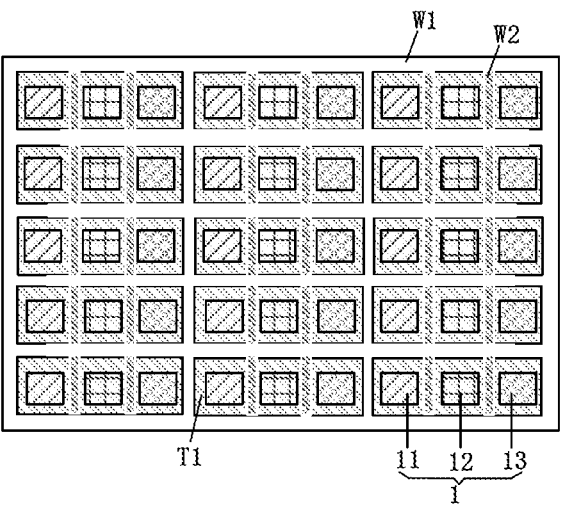

In an exemplary embodiment, the first reflective walls W1 and the second reflective walls W2 may be connected to form a mesh structure as shown in FIG. 7. In practical application, the first reflective walls W1 and the second reflective walls W2 may be set as of the integrated structure.

In an exemplary embodiment, the first reflective wall W1 and the second reflective wall W2 may be set separately of each other.

Figure 8:
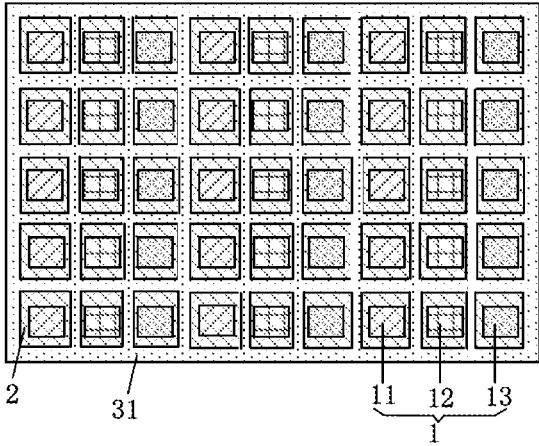

In an exemplary embodiment, referring to that shown in FIG. 5, the first microstructure layer 31 may be arranged on the surface of the functional layer 2 away from the substrate 100. Referring to that shown in FIG. 8, the orthographic projections of the first microstructure layer 31 on the substrate 100 respectively overlap the orthographic projections of the first reflective walls W1 on the substrate 100, and the orthographic projections of the first microstructure layer 31 on the substrate 100 respectively overlap the orthographic projections of the second reflective walls W2 on the substrate 100.

In an exemplary embodiment, the first microstructure layer 31 may be set on the surface of the functional layer 2 away from the substrate 100, the orthographic projections of the first microstructure layer 31 on the substrate 100 respectively overlap the orthographic projections of the first reflective walls W1 on the substrate 100, the orthographic projections of the first microstructure layer 31 on the substrate 100 respectively overlap the orthographic projections of the second reflective walls W2 on the substrate 100, and the orthographic projections of the first microstructure layer 31 on the substrate 100 overlap the orthographic projection of at least one light-emitting subunit on the substrate 100.

In an exemplary embodiment, referring to that shown in FIG. 6, the first microstructure layer 31 may be set on the surface of the reflective walls (including the first reflective walls W1 and the second reflective walls W2) away from the substrate 100, and the first microstructure layer 31 and the reflective walls are of the integrated structure. At this time, as shown in combination with FIG. 7 and FIG. 8, a contour of the orthographic projections of the first microstructure layer 31 on the substrate 100 respectively overlap contours of the orthographic projections of the reflective walls (including the first reflective walls W1 and the second reflective walls W2) on the substrate 100. Alternatively, the orthographic projections of the first microstructure layer 31 on the substrate 100 are respectively located within the orthographic projections of the reflective walls (including the first reflective walls W1 and the second reflective walls W2) on the substrate 100.

Figure 9:
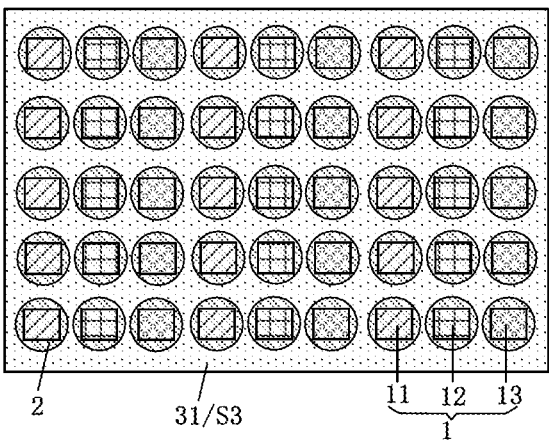

In some embodiments of the present application, referring to that shown in combination with FIGS. 5, 7 and 9, the orthographic projection S1 of the reflective wall on the substrate 100 is located within the orthographic projection S3 of the first microstructure layer 31 on the substrate 100, and the orthographic projection S2 of the light-emitting subunit on the substrate 100 and the orthographic projection S3 of the first microstructure layer 31 on the substrate 100 do not overlap each other. The reflective wall includes the first reflective wall W1 and the second reflective wall W2, and the first reflective wall W1 is connected with the second reflective wall W2.

Here, an inner contour of the orthographic projection S3 of the first microstructure layer 31 on the substrate 100 is not limited. Exemplarily, the inner contour of the orthographic projection S3 of the first microstructure layer 31 on the substrate 100 may be an arc, such as a circle shown in FIG. 9.

In an exemplary embodiment, the orthographic projection S1 of the reflective wall on the substrate 100 is located within the orthographic projection S3 of the first microstructure layer 31 on the substrate 100, which means that: a contour of the orthographic projection S1 of the reflective wall on the substrate 100 overlaps a contour of the orthographic projection S3 of the first microstructure layer 31 on the substrate 100. Alternatively, as shown in FIG. 5, the contour of the orthographic projection S1 of the reflective wall on the substrate 100 is located within the contour of the orthographic projection S3 of the first microstructure layer 31 on the substrate 100.

In some embodiments of the application, referring to that shown in FIG. 10, FIG. 11, FIG. 18 and FIG. 19, the display panel further includes the second microstructure layer 32. Orthographic projections of the second microstructure layer 32 on the substrate 100 respectively overlap the orthographic projections of the light-emitting units 1 on the substrate 100, and the orthographic projections of the second microstructure layer 32 on the substrate 100 are connected with the orthographic projections of the first microstructure layer 31 on the substrate 100.

In an exemplary embodiment, referring to that shown in FIG. 10, FIG. 11 and FIG. 18, the first microstructure layer 31 and the second microstructure layer 32 are set in the same layer, so the first microstructure layer 31 and the second microstructure layer 32 are connected.

The meaning of setting in the same layer here is that a distance between the first microstructure layer 31 and the substrate 100 along the direction perpendicular to the substrate 100 is equal to a distance between the second microstructure layer 32 and the substrate 100 along the direction perpendicular to the substrate 100. In this way, the first microstructure layer 31 and the second microstructure layer 32 may be prepared in a single impression (or engraving) process.

Exemplarily, referring to that shown in FIG. 10, the first microstructure layer 31 and the second microstructure layer 32 are both located on the surface of the functional layer 2 on the side away from the substrate 100.

Exemplarily, referring to that shown in FIG. 11, the first microstructure layer 31 is located on the surface of the side of the reflective walls (including the first reflective walls W1 and the second reflective walls W2) away from the substrate 100, the second microstructure layer 32 is located on the surface of the side of the first filler layer T1 away from the substrate 100, and the height of the first filler layer T1 on the substrate 100 along the direction perpendicular to the substrate 100 is equal to the height of the reflective wall on the substrate 100 along the direction perpendicular to the substrate 100.

Exemplarily, referring to that shown in FIG. 18, the functional layer 2 is the patterned film structure, the orthographic projection of the functional layer 2 on the substrate 100 overlaps the orthographic projections of the reflective walls (W1 and W2) on the substrate 100, and the orthographic projection of the functional layer 2 on the substrate 100 and the orthographic projections of the light-emitting units 1 on the substrate 100 do not overlap each other. The first microstructure layer 31 is located on the surface of the side of the functional layer 2 away from the substrate 100, the second microstructure layer 32 is located on the surface of the side of the second filler layer T2 away from the substrate 100, and a distance between the surface of the side of the functional layer 2 away from the substrate 100 and the substrate 100 along the direction perpendicular to the substrate 100 is equal to a distance between the surface of the side of the second filler layer T2 away from the substrate 100 and the substrate 100 along the direction perpendicular to the substrate 100.

In an exemplary embodiment, referring to that shown in FIG. 19, the first microstructure layer 31 and the second microstructure layer 32 are located in different layers, and the orthographic projections of the second microstructure layer 32 on the substrate 100 are connected with the orthographic projections of the first microstructure layer 31 on the substrate 100. Specifically, the first microstructure layer 31 is located on the surface of the side of the reflective walls away from the substrate 100, and the first microstructure layer 31 is located between the reflective walls and the functional layer 2. The second microstructure layer 32 is located on the surface of the side of the second filler layer T2 away from the substrate 100, and the distance between the surface of the second microstructure layer 32 away from the substrate 100 and the substrate 100 along the direction perpendicular to the substrate 100 is equal to the distance between the surface of the functional layer 2 away from the substrate 100 and the substrate 100 along the direction perpendicular to the substrate 100.

In some embodiments of the present application, both the surface of the first microstructure layer 31 away from the substrate 100 and the surface of the second microstructure layer 32 away from the substrate 100 have rough microstructures. A distribution density of the microstructures in the first microstructure layer 31 is greater than that in the second microstructure layer 32.

Here, the distribution density of the microstructures in the first microstructure layer 31 is not limited. For example, the microstructures in the first microstructure layer 31 may be uniformly distributed, or the microstructures in the first microstructure layer 31 may be distributed according to a certain density gradient.

Here, the distribution density of microstructures in the second microstructure layer 32 is not limited. For example, the microstructures in the second microstructure layer 32 may be uniformly distributed, or the microstructures in the second microstructure layer 32 may be distributed according to a certain density gradient.

In some embodiments of the present application, the distribution density of the microstructures gradually decreases along a first direction, which is a direction that the first microstructure layer 31 points to the second microstructure layer 32.

In practical applications, the problem of chromatic aberration of large view angle of the display panel may be aggravated with the increase of view angle. Therefore, the distribution density of the microstructures in the second microstructure layer 32 whose orthographic projection overlaps the orthographic projection of the light-emitting unit is set to be less than the distribution density of the microstructures in the first microstructure layer 31 whose orthographic projection surrounds the orthographic projection of the light-emitting unit 1, which may better improve the chromatic aberration of large view angle of the display panel and improve the display effect.

In some embodiments of the present application, referring to that shown in FIG. 10, in a circumstance that the orthographic projection of the functional layer 2 on the substrate 100 and the orthographic projection of the light-emitting unit 1 on the substrate 100 overlap, the second microstructure layer 32 is located on the side of the functional layer 2 away from the substrate 100, the second microstructure layer 32 and the functional layer 2 are of the integrated structure, and the second microstructure layer 32 and the first microstructure layer 31 are set in the same layer.

The meaning of setting in the same layer here is that: the distance between the first microstructure layer 31 and the substrate 100 along the direction perpendicular to the substrate 100 is equal to the distance between the second microstructure layer 32 and the substrate 100 along the direction perpendicular to the substrate 100. In this way, the first microstructure layer 20) 31 and the second microstructure layer 32 may be prepared in a single impression (or engraving) process.

In an exemplary embodiment, referring to that shown in FIG. 10, the second microstructure layer 32 and the first microstructure layer 31 are arranged in the same layer, the second microstructure layer 32 is located on the side of the functional layer 2 away from the substrate 100, and the first microstructure layer 31 is located on the side of the functional layer 2 away from the substrate 100.

In some embodiments of the present application, referring to that shown in FIG. 10, the functional layer 2, the first reflective walls W1 and the substrate 100 constitute an enclosed space, and both the light-emitting unit 1 and the second reflective walls W2 are all located in the enclosed space. The display panel further includes the first filling layer T1, the first filling layer T1 fills a space in the enclosed space except the light-emitting unit 1 and the second reflective walls W2, and at least one of the first filling layer T1 and the functional layer 2 includes diffusion particles.

In an exemplary embodiment, the first filling layer T1 is arranged on periphery of the light-emitting unit 1 to encapsulate and protect the light-emitting unit 1.

In an exemplary embodiment, the material of the functional layer 2 includes the black composite, and the material of the first filling layer T1 includes a light-transmitting composite. Alternatively, the functional layer 2 and the first filling layer T1 are of the integrated structure, and the materials of both the functional layer 2 and the first filling layer T1 include the black composite.

In an exemplary embodiment, the material of the functional layer 2 includes the black composite, and the material of the first filler layer T1 includes a light-transmitting adhesive.

Exemplarily, a refractive index of the light-transmitting adhesive ranges from 1.4 to 1.65, for example, the refractive index of the light-transmitting adhesive may be 1.48.

Exemplarily, the black composite may be black glue, and the black glue includes light-transmitting glue (such as silica gel) and carbon black, wherein the particle size of carbon black ranges from 10 nm to 500 nm.

Exemplarily, the light-transmitting composite may be white glue, and the white glue includes light-transmitting glue (such as silica gel) and titanium dioxide, wherein the particle size of titanium dioxide ranges from 10 nm to 300 mm.

At least one of the first filling layer T1 and the functional layer 2 includes diffusion particles, which means that: the first filling layer T1 includes diffusion particles, alternatively, the functional layer 2 includes diffusion particles, alternatively, both the first filling layer T1 and the functional layer 2 include diffusion particles.

Exemplarily, the diffusion particles may include inorganic particles, and the inorganic particles include titanium dioxide (TiO2) or light-transmitting glass particles.

Exemplarily, the diffusion particles may include organic particles, such as light-transmitting resin particles.

In the embodiment of the embodiment, by adding light-transmitting particles in the first filling layer T1, transmissivity of the display panel may be further improved, thereby improving the brightness of the display panel and reducing power consumption. The experiment shows that the transmissivity of the display panel may be improved by 10%-20% by adding transparent particles in the first filling layer T1.

It should be noted that a material of light-transmitting resin particles in the filling layer is different from a matrix material of the filling layer, both specific materials of which are not limited here and may be determined according to the actual situation.

In some embodiments of the present application, in a circumstance that the orthographic projection of the functional layer 2 on the substrate 100 and the orthographic projections of the light-emitting units 1 on the substrate 100 do not overlap each other, the display panel further includes the second filling layer T2, and the second filling layer T2 covers the light-emitting subunits (11, 12 and 13), wherein the second microstructure layer 32 is located on the side of the second filler layer T2 away from the substrate 100.

In an exemplary embodiment, referring to that shown in FIG. 18, the distance between the surface of the second filler layer T2 away from the substrate 100 and the substrate 100 along the direction perpendicular to the substrate 100 is equal to the distance between the surface of the functional layer 2 away from the substrate 100 and the substrate 100 along the direction perpendicular to the substrate 100. It may be understood that at this time, the surface of the second filling layer T2 far away from the substrate 100 and the surface of the functional layer 2 far away from the substrate 100 are in the same plane;

wherein the second microstructure layer 32 and the second filling layer T2 are of the integrated structure, and the second microstructure layer 32 and the first microstructure layer 31 are arranged in the same layer.

In an exemplary embodiment, the material of the second filling layer T2 is the same as that of the first filling layer T1.

Exemplarily, the material of the second filling layer T2 includes the light-transmitting adhesive.

Exemplarily, the refractive index of the light-transmitting adhesive ranges from 1.4 to 1.65, for example, the refractive index of the light-transmitting adhesive may be 1.48.

In an exemplary embodiment, the material of the functional layer 2 includes the black composite, and the material of the second filling layer T2 includes the light-transmitting composite. Alternatively, the functional layer 2 and the second filling layer T2 are of the integrated structure, and both the materials of the functional layer 2 and the second filling layer T2 include black composite.

Exemplarily, the light-transmitting composite may be the white glue, and the white glue includes light-transmitting glue (such as silica gel) and titanium dioxide, wherein the particle size of titanium dioxide ranges from 10 nm to 300 nm.

In an exemplary embodiment, the material of the second filler layer T2 may be the same as that of the first filler layer T1.

Figure 22:
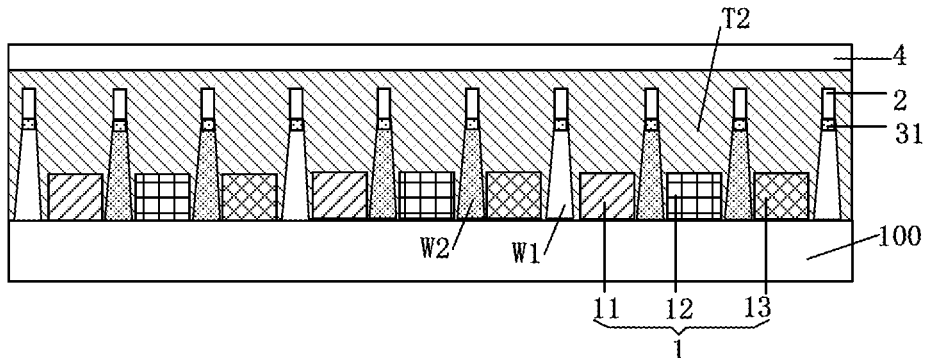

In the exemplary embodiment, referring to that shown in FIG. 17 and FIG. 22, the second filling layer T2 further covers the patterned functional layer 2 to facilitate preparation of a subsequent protective layer 4.

When the second microstructure layer 32 is set on the surface of the second filler layer T2 away from the substrate 100, the distance between the surface of the second microstructure layer 32 away from the substrate 100 and the substrate 100 along the direction perpendicular to the substrate 100 is greater than the distance between the surface of the first microstructure layer 31 away from the substrate 100 and the substrate 100 along the direction perpendicular to the substrate 100.

In some embodiments of the application, the display panel further includes the protective layer 4, which covers the second filling layer T2 and the functional layer 2.

In an exemplary embodiment, referring to that shown in FIG. 2, the protection layer 4 may directly contact the functional layer 2. Alternatively, referring to that shown in FIG. 1, the protective layer 4 may directly contact the functional layer 2, and the protective layer 4 may further directly contact the first microstructure layer 31. Alternatively, referring to that shown in FIG. 10, the protective layer 4 is in direct contact with the first microstructure layer 31 and the second microstructure layer 32 at the same time. Alternatively, referring to that shown in FIG. 15, the protective layer 4 may further be in direct contact with the second filling layer T2.

The material of the protective layer 4 is not limited here, and may be specifically determined according to an actual situation.

Exemplarily, the protective layer 4 may be a glass substrate.

In an exemplary embodiment, the refractive index of the reflective wall is less than the refractive index of the first filled layer T1, and the reflective wall is configured to enable at least part of light emitted from the first filled layer T1 to the reflective wall to occur total reflection.

In an exemplary embodiment, the refractive index of the reflective wall is less than the refractive index of the second filled layer T2, and the reflective wall is configured to enable at least part of light emitted from the second filled layer T2 to the reflective wall to occur total reflection, wherein the reflective wall includes the first reflective walls W1 and the second reflective walls W2.

In an exemplary embodiment, the material of the reflective wall includes a light-transmitting substrate and reflective particles.

Exemplarily, the material of the light-transmitting substrate of the reflective wall may be the white glue, and the reflective particles may include titanium dioxide.

In the embodiment of the present application, by setting the first reflective walls W1 respectively surrounding the respective light-emitting units 1, the height h2 of the first reflective walls W1 along the direction perpendicular to the substrate 100 is greater than the height h1 of the light-emitting units 1 along the direction perpendicular to the substrate 100. In this way, the first reflective wall W1 may reflect at least part of the large angle light emitted by the light-emitting unit 1, and improve the light efficiency of the display panel. In addition, the side of the first reflective wall W1 away from the substrate 100 is provided with the first microstructure layer 31. Since the orthographic projections of the first microstructure layer 31 on the substrate 100 at least respectively overlap the orthographic projections of the first reflective walls W1 on the substrate 100, the orthographic projections of the first microstructure layer 31 on the substrate 100 respectively surround the orthographic projections of the light-emitting units 1 on the substrate 100, so that the first microstructure layer 31 may disperse the large angle light emitted by the light-emitting unit 1 and passing through the first microstructure layer 31, thereby improving the chromatic aberration of large view angle of the display panel.

In actual test, by using the display panel provided by the embodiments of the application, compared with the display panel in the related technology, on the one hand, the chromatic aberration of view angle may be reduced from 30% to less than 12%, reaching an acceptable chromatic aberration range of the display panel. On the other hand, the light output efficiency may be improved by 20%-200%. On another hand, in a circumstance that the functional layer 2 is prepared with the black glue and the first microstructure layer 31 is arranged on the side of the functional layer 2 away from the substrate 1, it may ensure that the chromatic aberration of large view angle is within the specifications, and may further make the contrast of the display panel reach a million level. In addition, compared with lens structures in the related technology, the microstructure layer provided by the embodiments of the application may further reduce the thickness of the display panel to achieve thinness, while improving the chromatic aberration of large view angle and enhancing brightness uniformity of the display panel.

An embodiment of the application further provides a display device, including a display panel as described above.

The specific structures of the display panel included in the display device will not be described here, the specific details of which may be referred to the previous description.

The above display device is Mini/Micro Light-Emitting Diode (Mini/Micro LED) display device.

In the display devices provided by the embodiments of the present application, by setting the first reflective walls W1 respectively surrounding the respective light-emitting units 1, and the height h2 of the first reflective walls W1 along the direction perpendicular to the substrate 100 being greater than the height h1 of the light-emitting units 1 along the direction perpendicular to the substrate 100, the first reflective wall W1 may reflect at least part of the large angle light emitted by the light-emitting unit 1, so as to improve the light efficiency of the display panel. In addition, the side of the first reflective walls W1 away from the substrate 100 is provided with the first microstructure layer 31. Since the orthographic projections of the first microstructure layer 31 on the substrate 100 at least respectively overlap the orthographic projections of the first reflective walls W1 on the substrate 100, the orthographic projections of the first microstructure layer 31 on the substrate 100 respectively surround the orthographic projections of the light-emitting units 1 on the substrate 100, the first microstructure layer 31 may disperse the large angle light emitted by the light-emitting unit 1 and passing through the first microstructure layer 31, thereby improving the chromatic aberration of large view angle of the display panel.

An embodiment of the application further provides a method for preparing the display panel, as shown in FIG. 12, specifically including the following steps S1-S4.

Figure 26:
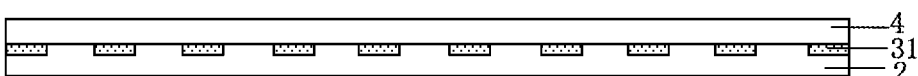
FIG. 26-FIG. 28 are intermediate structure diagrams of a method for preparing another display panel, provided by an embodiment of the present application.

S1. Forming structures complementary to the microstructures of the first microstructure layer 31 on the protective layer 4 (glass substrate) by a carving process, forming the functional layer 2 of full range on the glass substrate, and forming the first microstructure layer 31 as shown in FIG. 26 on a surface of the functional layer 2 in contact with the glass substrate by embossing.

Figure 27:
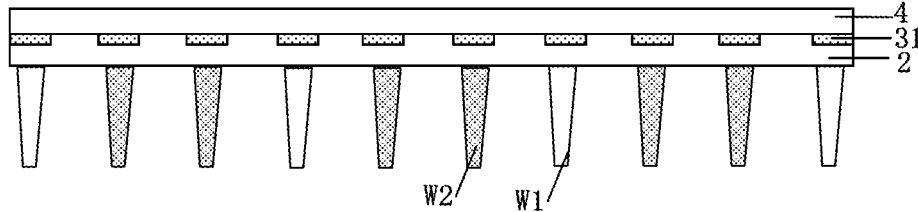

S2. Forming reflective walls (including the first reflective walls W1 and the second reflective walls W2) as shown in FIG. 27 on a surface of the functional layer 2 away from the protective layer 4.

Figure 28:
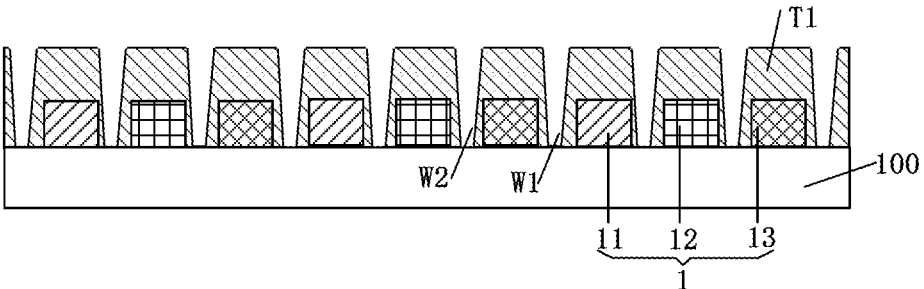

S3. Fixing the respective light-emitting subunits on the substrate 100, and forming the patterned first filler layer T1 as shown in FIG. 28.

S4. Attaching a structure shown in FIG. 27 to a structure shown in FIG. 28, to obtain the display panel shown in FIG. 12.

It should be noted that other structures and films may further be included between the substrate 100 and the respective light-emitting subunits. Here, only the structures related to the invention point are introduced, and other structures and components included in the display panel may be referred to relevant technologies.

An embodiment of the application further provides a method for preparing the display panel as shown in FIG. 20, specifically including the following steps S01-S4.

Figure 23:
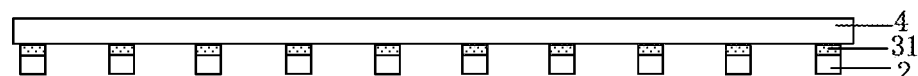
FIG. 23-FIG. 25 are intermediate structure diagrams of a method for preparing a display panel, provided by an embodiment of the present application.

S01. Forming structures complementary to the microstructures of the first microstructure layer 31 on the protective layer 4 (glass substrate) by a carving process, forming the patterned functional layer 2 on the glass substrate, and forming the first microstructure layer 31 as shown in FIG. 23 on a surface of the functional layer 2 in contact with the glass substrate by embossing.

Figure 24:
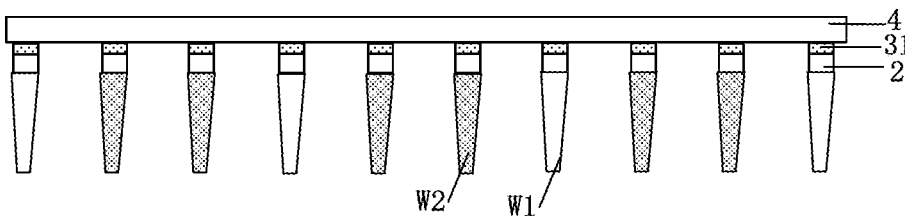

S02. Forming reflective walls (including the first reflective walls W1 and the second reflective walls W2) as shown in FIG. 24 on a surface of the functional layer 2 away from the protective layer 4.

Figure 25:
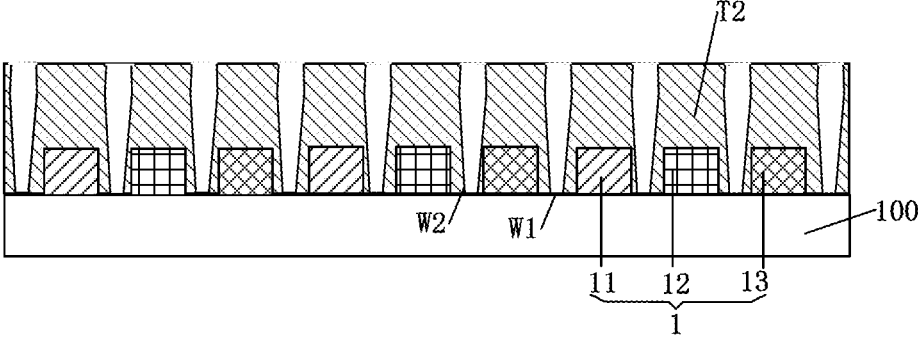

S3. Fixing the respective light-emitting subunits on the substrate 100, and forming the patterned second filler layer T2 as shown in FIG. 25.

S4. Attaching a structure shown in FIG. 24 and a structure shown in FIG. 25, to obtain the display panel shown in FIG. 20.

The preparation method of display panels with other structures provided in the embodiments of the application may be referred to the above method, or determined by combining with the preparation method in related technologies, which will not be repeated here.

The above is only the specific implementation modes of the application, but the scope of protection of the application is not limited to this. Any person skilled in the technical field may easily think of changes or replacements within the technical scope disclosed in the application, which should be covered in the scope of protection of the application. Therefore, the protection scope of the application shall be subject to the protection scope of the claims.

The invention claimed is:

1. A display panel, comprising:

a substrate;

at least one light-emitting unit, located on the substrate, wherein the light-emitting unit comprises a plurality of light-emitting subunits on the substrate;

first reflective walls, each arranged surrounding the light-emitting unit, wherein a height of the first reflective walls along a direction perpendicular to the substrate is greater than a height of the light-emitting unit along the direction perpendicular to the substrate;

second reflective walls, each arranged between two adjacent light-emitting subunits in a same light-emitting unit, wherein the first reflective walls and the second reflective walls are arranged in a same layer; and a first microstructure layer, located on a side of the first reflective walls and the second reflective walls away from the substrate, wherein orthographic projections of the first reflective walls and the second reflective walls on the substrate are within orthographic projections of the first microstructure layer on the substrate, and a distance between the first microstructure layer and the substrate along the direction perpendicular to the substrate is greater than a distance between a surface of the first reflective walls and the second reflective walls away from the substrate and the substrate along the direction perpendicular to the substrate, and wherein orthographic projections of the light-emitting subunits on the substrate and the orthographic projections of the first microstructure layer on the substrate do not overlap each other, and the first reflective walls are connected with the second reflective walls.

2. The display panel according to claim 1, wherein the first microstructure layer and the first reflective walls are of an integrated structure; and the distance between the first microstructure layer and the substrate along the direction perpendicular to the substrate is equal to the distance between the surface of the first reflective walls away from the substrate and the substrate along the direction perpendicular to the substrate.

3. A display device, comprising the display panel according to claim 1.

4. The display panel according to claim 1, wherein the functional layer, the first reflective walls and the substrate constitute an enclosed space, and the light-emitting unit and the second reflective walls are all located in the enclosed space; and the display panel further comprises a first filling layer, the first filling layer fills a space in the enclosed space except the light-emitting unit and the second reflective walls, and at least one of the first filling layer and the functional layer comprises diffusion particles.

5. The display panel according to claim 4, wherein a material of the functional layer comprises a black composite, and a material of the first filling layer comprises a light-transmitting composite; or the functional layer and the first filling layer are of the integrated structure, and the materials of both the functional layer and the first filling layer comprise the black composite.

6. The display panel according to claim 4, wherein a refractive index of the reflective wall is less than a refractive index of the first filled layer, and the reflective wall is configured to enable at least part of light emitted from the first filled layer to the reflective wall to occur total reflection.

7. The display panel according to claim 1, wherein the display panel further comprises a functional layer, the functional layer is located on the side of the first reflective walls and the second reflective walls away from the substrate, the first microstructure layer is located on a side of the functional layer away from the first reflective walls and the second reflective walls, and the first microstructure layer and the functional layer are of an integrated structure.

8. The display panel according to claim 7, wherein an orthographic projection of the functional layer on the substrate overlaps the orthographic projections of the first reflective walls and the second reflective walls on the substrate, and the orthographic projection of the functional layer on the substrate overlaps the orthographic projection of the light-emitting unit on the substrate.

9. The display panel according to claim 7, wherein the display panel further comprises a protective layer, and the protective layer covers.

10. The display panel according to claim 7, wherein the functional layer is a patterned film structure, an orthographic projection of the functional layer on the substrate overlaps the orthographic projections of the first reflective walls on the substrate, and the orthographic projection of the functional layer on the substrate does not overlap the orthographic projection of the light-emitting unit on the substrate.

11. The display panel according to claim 10, wherein the light-emitting unit comprises a plurality of light-emitting subunits on the substrate, a second reflective wall is further arranged between two adjacent light-emitting subunits in a same light-emitting unit, and the first reflective walls and the second reflective walls are arranged in a same layer; and the orthographic projection of the functional layer on the substrate overlaps orthographic projections of the second reflective walls on the substrate, and the orthographic projections of the first microstructure layer on the substrate overlap the orthographic projections of the second reflective walls on the substrate.

12. The display panel according to claim 1, wherein the display panel further comprises a second microstructure layer; and orthographic projections of the second microstructure layer on the substrate overlap the orthographic projection of the light-emitting unit on the substrate, and the orthographic projections of the second microstructure layer on the substrate are connected with the orthographic projections of the first microstructure layer on the substrate.

13. The display panel according to claim 12, wherein in a circumstance that the orthographic projection of the functional layer on the substrate overlaps the orthographic projection of the light-emitting unit on the substrate, the second microstructure layer is located on a side of the functional layer away from the substrate, and the second microstructure layer and the functional layer are of the integrated structure, and the second microstructure layer and the first microstructure layer are arranged in a same layer.

14. The display panel according to claim 12, wherein both a surface of the first microstructure layer away from the substrate and a surface of the second microstructure layer away from the substrate have rough microstructures, and a distribution density of the microstructures in the first microstructure layer is greater than that in the second microstructure layer.

15. The display panel according to claim 14, wherein the distribution density of the microstructures gradually decreases along a first direction, and the first direction is a direction that the first microstructure layer points to the second microstructure layer.

16. The display panel according to claim 12, wherein in a circumstance that the orthographic projection of the functional layer on the substrate does not overlap the orthographic projection of the light-emitting unit on the substrate, the display panel further comprises a second filling layer, and the second filling layer covers the light-emitting subunits; and the second microstructure layer is located on a side of the second filling layer away from the substrate.

17. The display panel according to claim 16, wherein a distance between a surface of the second filled layer away from the substrate and the substrate along the direction perpendicular to the substrate is equal to a distance between a surface of the functional layer away from the substrate and the substrate along the direction perpendicular to the substrate; and the second microstructure layer and the second filling layer are of the integrated structure, and the second microstructure layer and the first microstructure layer are arranged in a same layer.

18. The display panel according to claim 16, wherein the second filling layer further covers the functional layer, and a distance between a surface of the second microstructure layer away from the substrate and the substrate along the direction perpendicular to the substrate is greater than a distance between a surface of the first microstructure layer away from the substrate and the substrate along the direction perpendicular to the substrate.

* * * * *